United States Patent [19]
Boerstler et al.

[11] Patent Number: 5,821,809
[45] Date of Patent: Oct. 13, 1998

[54] CMOS HIGH-SPEED DIFFERENTIAL TO SINGLE-ENDED CONVERTER CIRCUIT

[75] Inventors: David William Boerstler, Round Rock; Daniel Mark Dreps, Georgetown, both of Tex.

[73] Assignee: International Business Machines Corporation, Armonk, N.Y.

[21] Appl. No.: 652,056

[22] Filed: May 23, 1996

[51] Int. Cl.⁶ .............................. H03F 3/45; H03K 17/04
[52] U.S. Cl. ........................ 327/563; 327/374; 327/407; 327/333; 327/70; 330/253; 330/295; 326/66
[58] Field of Search ................................ 326/66, 77, 115; 330/257, 258, 260, 261, 253, 254, 295; 327/52, 54, 65, 67, 560, 562, 563, 56, 58, 70, 80, 81, 333, 407, 53, 66, 77, 78, 79, 85, 87, 88, 89, 69, 374, 375, 376, 377

[56] References Cited

U.S. PATENT DOCUMENTS

| | | | |
|---|---|---|---|
| 3,961,279 | 6/1976 | Davis | 330/261 |
| 3,988,595 | 10/1976 | Eatock | 327/67 |
| 4,442,408 | 4/1984 | Le | 330/261 |
| 4,602,168 | 7/1986 | Single . | |
| 4,728,900 | 3/1988 | Nakagawara et al. | 327/52 |
| 4,808,848 | 2/1989 | Miller . | |
| 4,829,270 | 5/1989 | Anderson et al. | 330/280 |
| 4,904,952 | 2/1990 | Tanimoto | 330/261 |
| 5,105,107 | 4/1992 | Wilcox . | |
| 5,187,448 | 2/1993 | Brooks et al. | 330/258 |
| 5,374,859 | 12/1994 | Doyle et al. | 330/253 |
| 5,399,995 | 3/1995 | Kardontchik et al. | 331/17 |
| 5,406,219 | 4/1995 | Lou | 330/253 |
| 5,406,221 | 4/1995 | Samani et al. | 330/254 |
| 5,410,266 | 4/1995 | Manley | 326/73 |
| 5,420,539 | 5/1995 | Fensch | 330/253 |
| 5,434,821 | 7/1995 | Watanabe et al. | 327/52 |
| 5,504,452 | 4/1996 | Takenaka | 327/541 |
| 5,530,401 | 6/1996 | Cao et al. | 327/563 |
| 5,557,238 | 9/1996 | Weiss | 330/261 |

OTHER PUBLICATIONS

Chappell, Barbara A., et al., "Fast CMOS ECL Receivers With 100–mV Worst–Case Sensitivity," *IEEE Journal of Solid–State Circuits*, vol. 23, No. 1, Feb. 1988, pp. S59–65.

*Primary Examiner*—Timothy P. Callahan
*Assistant Examiner*—Terry L. Englund
*Attorney, Agent, or Firm*—Winstead Sechrest & Minick P.C.; Anthony V. S. England

[57] ABSTRACT

A CMOS differential to single-ended converter is implemented. A differential input stage comprised of a pair of N-channel transistors draws current through two fixed current P-channel load transistors. A first N-channel differential transistor provides negative feedback bias control of a current source transistor coupled to the differential input stage. The negative feedback control provides increased current gain in the second N-channel transistor, which drives a CMOS inverter to a full rail-to-rail voltage swing on its output.

17 Claims, 3 Drawing Sheets

CMOS HIGH-SPEED DIFFERENTIAL TO SINGLE-ENDED CONVERTER CIRCUIT

TECHNICAL FIELD

The present invention relates in general to electronic circuits and systems and, in particular, to circuits and systems for converting a received differential signal to a single-ended signal at CMOS levels.

BACKGROUND INFORMATION

Circuits for receiving a differential input signal and converting it to a single-ended output signal are widely known in the art. U.S. Pat. No. 4,808,848 to Miller discloses a CMOS high speed differential to single ended comparator using parasitic bipolar transistors to provide a high transconductance, low offset voltage and quick response time. U.S. Pat. No. 5,399,995 to Kardontchik et al. discloses a differential inverter, which includes a bias circuit and current mirror. U.S. Pat. No. 4,602,168 to Single discloses a CMOS comparator that has a low offset without trimming. U.S. Pat. No. 5,410,266 to Manley discloses a CMOS circuit for converting voltage levels from a received differential emitter-coupled logic (ECL) signal to a CMOS level. U.S. Pat. No. 5,406,219 to Lou discloses circuitry for fast conversion of a received differential input to a single-ended output. U.S. Pat. No. 5,105,107 to Wilcox discloses a high speed CMOS differential input to single-ended output converter controlled by a biasing means. U.S. Pat. No. 5,420,539 to Fensch discloses a CMOS differential amplifier employing a common mode negative feedback stage. Additionally, numerous ECL to CMOS converter circuits are described in *Fast CMOS ECL Receivers With 100-mV Worst-Case Sensitivity*, Chappell et al., IEEE Journal of Solid State Circuits, Vol. 23, pp. 59–65. The teachings disclosed in these references are hereby incorporated by reference in the present disclosure as if fully set forth herein.

However, the high-speed differential to single-ended converters found in the prior art suffer from inherent design limitations that limit the prior art circuits' ability to convert differential input signals of low amplitudes, particularly if the centerpoint of the differential input signal is skewed from the centerpoint of the CMOS rail voltages. Additionally, many of the prior art designs exhibit large differences between the rise time delays and fall time delay in the single-ended output signal, thereby causing unacceptable distortions in the ideal 50% duty cycle of the input differential signal.

There is therefore a need for high-speed differential to single-ended converter circuits that provide greater gain while maintaining close adherence to a 50% duty cycle.

There is a still further need for high-speed differential to single-ended converter circuits capable of converting low-amplitude differential inputs to single-ended CMOS outputs, even if the differential input signal is skewed away from the centerpoint of the CMOS rail voltages.

SUMMARY OF THE INVENTION

The principles of the present invention are embodied in a converter circuit for converting a pair of differential input signals to a single-ended output signal comprising a first input terminal for receiving a first differential input signal; a second input terminal for receiving a second differential input signal; an output terminal; and a differential input stage comprising a first current load device coupled to a high voltage rail, wherein a first load current through the first current load device is determined by a static reference voltage; and a second current load device coupled to the high voltage rail, wherein a second load current through the second current load device is controlled by the static reference voltage. The differential input stage further comprises a first input means coupled to the first current load device and the first input terminal for receiving the first differential input signal and controlling a first branch current through a first branch of the differential input stage, wherein the first input means generating an output signal for transmission to the output terminal. The differential input stage also comprises a second input means coupled to the second current load device and the second input terminal for receiving the second differential input signal, controlling a second branch current through a second branch of the differential input stage, and generating a control signal for controlling a third current in a current source device coupled to a low voltage rail and to the differential input stage.

In another embodiment of the present invention, a converter circuit is provided for converting a differential input signal to a CMOS level single-ended output signal, the converter circuit comprising a first non-inverting differential amplifier for receiving the differential input signal and generating a first output signal in-phase with the differential input signal; and a first inverting differential amplifier for receiving the differential input signal and generating a second output signal 180° out-of phase with the differential input signal. The converter circuit further comprises a second non-inverting differential amplifier for receiving the first and second output signals and generating a third output signal in-phase with the differential input signal and a third non-inverting differential amplifier for receiving the first and second output signals and generating a fourth output signal in-phase with the differential input signal The foregoing has outlined rather broadly the features and technical advantages of the present invention in order that the detailed description of the invention that follows may be better understood. Additional features and advantages of the CMOS converter circuit will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
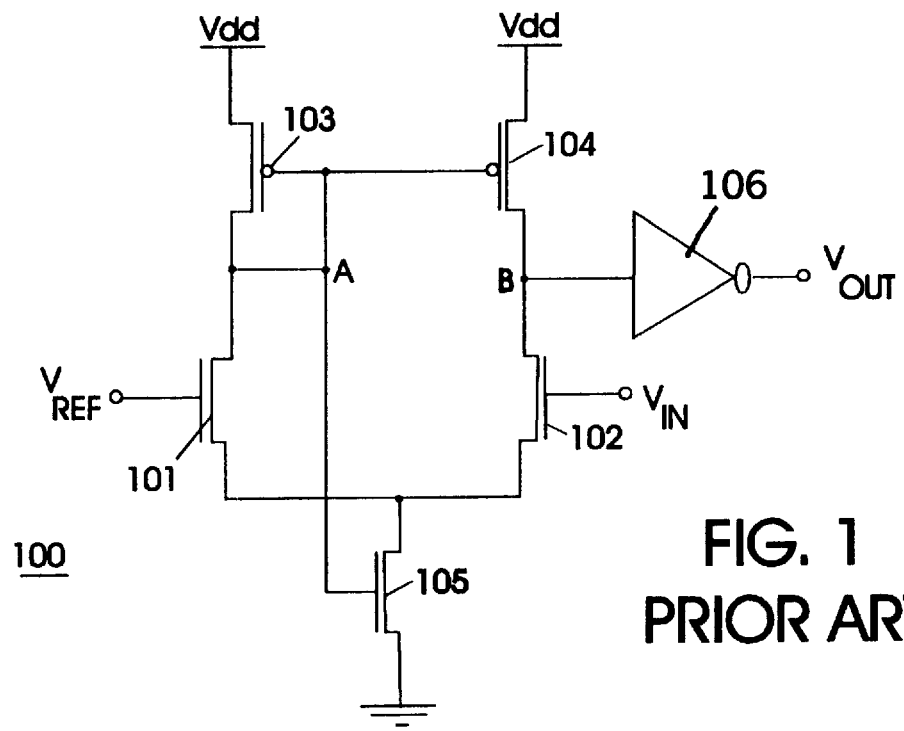
FIG. 1 is a receiver circuit for receiving a differential input signal and converting it to CMOS levels in accordance with the prior art.
Figure 2:
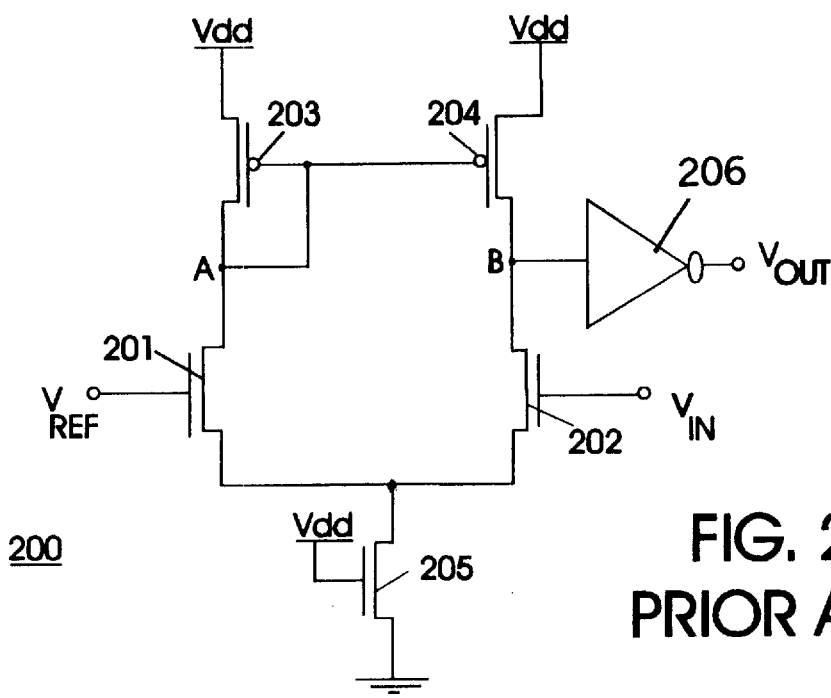
FIG. 2 is another receiver circuit for receiving a differential input signal and converting it to CMOS levels in accordance with the prior art.
Figure 3:
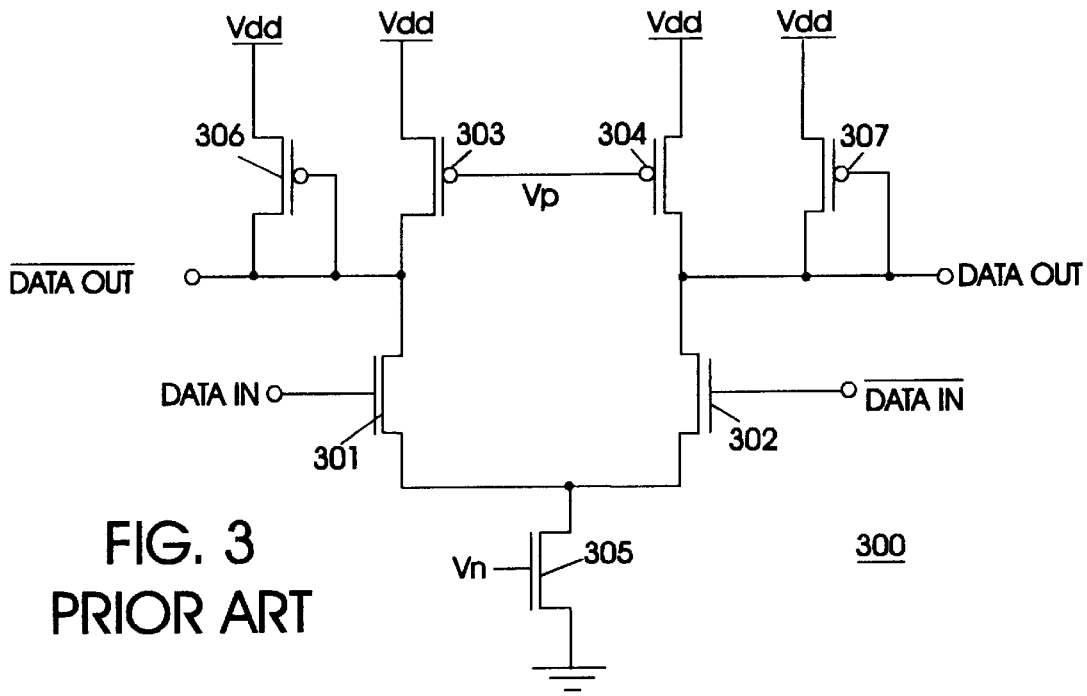
FIG. 3 is another receiver circuit for receiving a differential input signal and converting it to CMOS levels in accordance with the prior art.

Before discussing the present invention, it is helpful to examine some of the differential to single-ended circuits disclosed in the prior art and the inherent disadvantages in those designs. FIGS. 1–3 show commonly used differential to single-ended CMOS circuit designs found in the prior art.

FIG. 1 depicts a double-mirror-compensated (DMC) CMOS receiver circuit 100 for receiving differential signals from either off-chip or on-chip sources. Signal $V_{REF}$ is a mid-range reference voltage level hand $V_{IN}$ is an input signal having a reduced voltage swing about $V_{REF}$. A differential amplifier comprising transistors 101–105 drives an output inverter 106 coupled to node B. The reference voltage and the input signal are supplied to the gates of N-channel field effect transistors (NFETs) 101 and 102. P-channel field effect transistors (PFETs) 103 and 104 form a commonly used mirror bias configuration, where PFET 103 is a diode-connected device.

The gate of NFET 105 is tied to node A to provide a variable bias on NFET 105 as a function of the differential input voltage. The signal appearing at Node A is the input signal, $V_{IN}$, slightly attenuated. This technique provides higher voltage gain at the output of the differential amplifier (transistors 101–105) by driving the gates of both the load device, PFET 104, and the current-source device NFET 105 in the same direction. This circuit has inherent duty-cycle error due to the fact that in order to pull up Node B, the current from NFET 105 must be steered through NFET 101 and PFETs 103 and 104. This results in a longer delay than the pull-down of Node B, where NFET 105 is switched through NFET 102 only.

FIG. 2 is another commonly used converter circuit 200 for receiving differential signals from either off-chip or on-chip sources. Signal $V_{REF}$ is a mid-range reference voltage level and $V_{IN}$ is an input signal having a reduced voltage swing about $V_{REF}$. As in FIG. 1, transistors 201–205 form a differential amplifier that drives an output inverter 206 coupled to node B. The reference voltage and the input signal are supplied to the gates of NFETs 201 and 202. PFETs 203 and 204 again form a mirror bias configuration, where PFET 203 is a diode-connected device.

In circuit 200, however, the gate of NFET 205 is tied to $V_{DD}$. Since $V_{DD}$ is fixed, the gate of NFET 205 is not driven with the gate of PFET 204 and the gain advantage described in FIG. 1 is lost. Under normal conditions, circuit 200 performs very similarly to circuit 100 in FIG. 1. Under worst-case conditions, however, the poor compensation in current-source biasing of NFET 205 results in too large of an offset for sensing 100 mV input signal amplitudes. Also, circuit 200 has inherent duty cycle error as previously described.

Although $V_{REF}$ and $V_{IN}$ are described in FIGS. 1 and 2 as a fixed reference and a variable input that swings above and below the fixed reference, the operations of circuits 100 and 200 would be essentially unchanged if $V_{REF}$ and $V_{IN}$ were a true differential input, namely, $V_{REF}$ goes high as $V_{IN}$ goes low and vice versa.

FIG. 3 depicts converter circuit 300, which is commonly used in CMOS voltage controlled oscillator (VCO) designs. Signals $DATA\ IN$ and $\overline{DATA\ IN}$ are received differential signals that are applied to the gates of NFETs 301 and 302, respectively. When DATA IN is high, $\overline{DATA\ IN}$ is low. When DATA IN is low, $\overline{DATA\ IN}$ is high. Converter circuit 300 produces two CMOS level output signals that are 180° out of phase with each other. Output signal DATA OUT is in phase with input signal DATA IN. Output signal $\overline{DATA\ OUT}$ is in phase with input signal $\overline{DATA\ IN}$.

Transistors 301–305 of converter circuit 300 form a differential amplifier, as in FIGS. 1 and 2. The gates of PFETs 303 and 304 are biased by voltage $V_P$ and the gate of NFET 305 is biased by voltage $V_N$ in order to achieve partial compensation for variations in $V_{DD}$, temperature, and voltage. PFETs 306 and 307 are coupled as diode devices in parallel with PFETs 303 and 304, respectively. The threshold voltages, $V_{TP}$ of PFETs 306 and 307, are used to clamp the swing levels of DATA OUT and $\overline{DATA\ OUT}$ to a level that is defined by the current of current source NFET 305 and the size ratios of the PFETs to the NFETs. Typically, the clamping level is about one volt below $V_{DD}$. Thus, in low-power CMOS systems where $V_{DD}$ is typically 3 volts or lower, the voltage swing on DATA OUT and $\overline{DATA\ OUT}$ is between 3 volts and about 2 volts. Converter circuit 300 does not have the duty cycle problems of FIGS. 1 and 2 due to its symmetrical nature.

Figure 4:
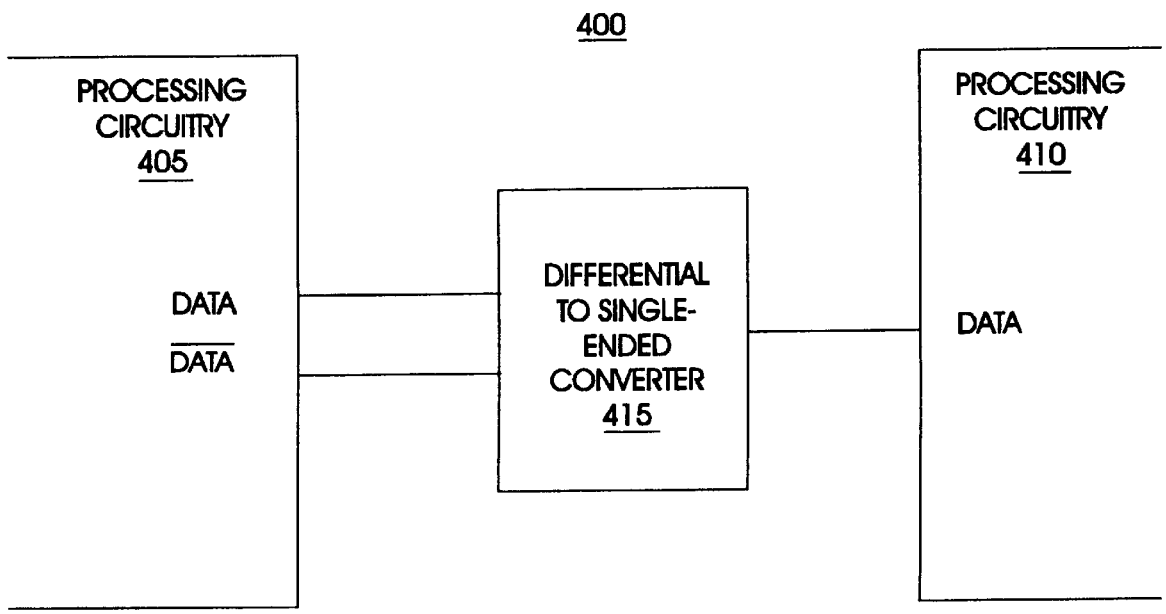
FIG. 4 is a processing circuit containing a CMOS level converter circuit according to the present invention.

FIG. 4 depicts an integrated circuit 400 containing a first block of processing circuitry 405 for transferring data to a second block of processing circuitry 410 via an improved differential-to-single-ended converter circuit 415 according to the present invention. Processing circuitry 405 produces a differential output signal, shown as DATA and $\overline{DATA}$. Convertor 415 receives the differential input signal and generates a single-ended output signal that is received as the signal $\overline{DATA}$ by processing circuitry 410. In other embodiments of the present invention, either processing circuitry 405 or processing circuitry 410, or both, may be contained in an external circuit so that converter 415 receives the differential input signal from an off-chip source and drives the output signal to an off-chip source.

Figure 5:
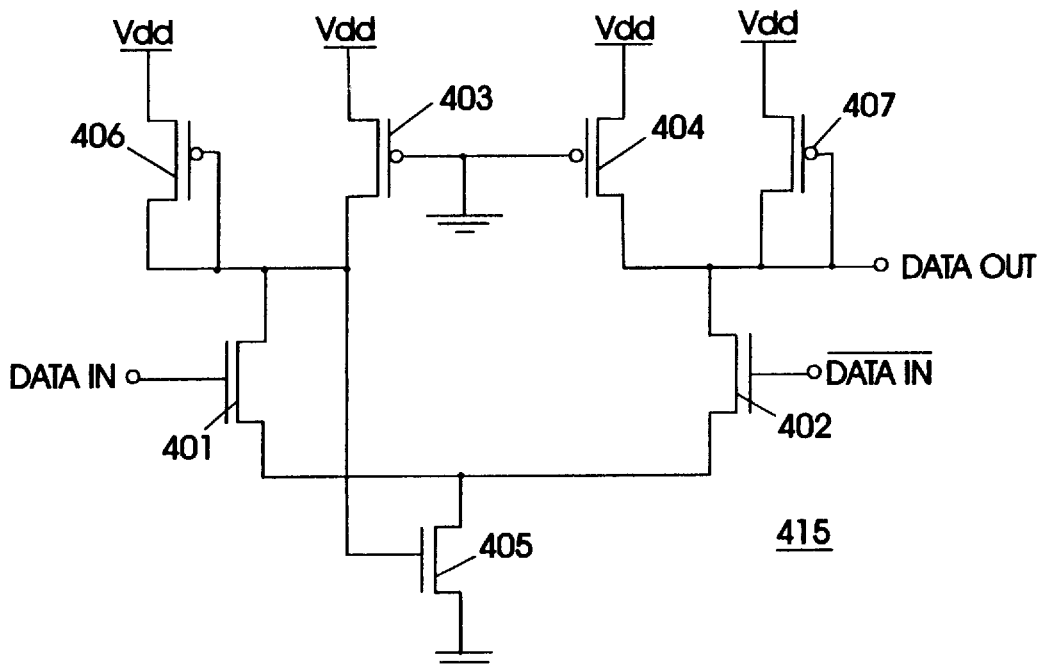
FIG. 5 is a level converter circuit for receiving a differential input signal and converting it to single-ended CMOS levels according to an embodiment of the present invention.

FIG. 5 depicts level converter circuit 415 in greater detail. Converter circuit 415 of FIG. 5 provides high voltage gain for a low differential-swing input signal. As in FIG. 4, the voltage level at $DATA\ OUT$ and the voltage level at the gate of PFET 406 are clamped at a level that is defined by the relative sizes of PFETs 403, 404, 406 and 407 to NFETs 401, 402 and 405. Again, this level is typically at about 1 volt below $V_{DD}$. However, the gates of PFETs 403 and 404 are grounded so that PFETs 403 and 404 act as pre-charge devices rather than as current mirrors.

The gate of NFET 405 is connected to the gate of PFET 406 to provide feedback control to the NFET 405 gate, thereby increasing the gain (and the speed) of the differential amplifier. The current in NFET 405 is the sum of the current through NFET 401 and NFET 402. As the voltage on the gate of NFET 401 rises, NFET 401 becomes more conductive and the voltage on NFET 405 gate/NFET 401 source falls as more current is drawn through PFET 403 and PFET 406. The lowering of the voltage on NFET 405 gate makes NFET 405 less "ON", thereby lowering current through NFET 405. The simultaneous increase of current through NFET 401 and the lessening of total current through NFET 405 combine to greatly decrease current through NFET 402. This cumulative change in current through NFET 402 results in an amplification of the voltage rise at the source of NFET 402 (i.e., at the output, $DATA\ OUT$). Conversely, when the voltage falls on the gate of NFET 401, the cumulative change in current through NFET 402 results in an amplification of the voltage decrease at the source of NFET 402.

Since there is no mirroring of current as in the FIG. 1 circuit, there is no symmetry distortion to affect the duty cycle. The signal $\overline{DATA\ OUT}$ of circuit 415 can be fed into a simple inverter which has its switching threshold designed at $((V_{DD}-V_{DATA\ OUT}\ (min))/2)$. For example, in a low power CMOS implementation where $V_{DD}$ is 3 volts (or lower) and the output is clamped at 2 volts by PFET 407, the switching threshold for the inverter would be 2.5 volts. The output of the inverter would then be restored to a full rail-to-rail voltage swing. Converter circuit 415 provides a faster, more symmetrical differential to single-ended conversion than the prior art devices.

Figure 6:
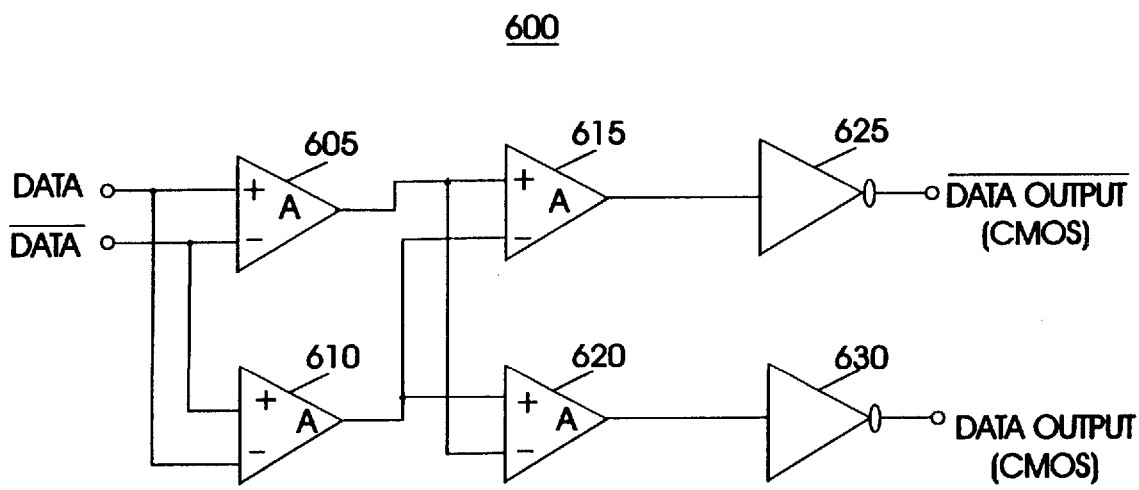
FIG. 6 depicts a cascade configuration of the circuit depicted in FIG. 5, according to an embodiment of the present invention.

FIG. 6 shows circuit 415 of FIG. 5 implemented for high-speed, low-power applications, such as in a CMOS phase-locked loop (PLL) where a differential voltage controlled oscillator (VCO) swing must be converted to single-ended CMOS levels. In these applications, the differential swing on the input to converter circuit 415 may be as low as 300 mV. In other words, $V_{DD}$ may be equal to Logic 1 and $V_{DD}$–0.3 may be equal to Logic 0. The differential signal usually runs at twice the system clock speed, so input loading of the differential to single ended stage must be kept low. Preserving 50% duty cycle is also important, especially where four-phase clock generation is required, since any offset from perfect 50% duty cycle causes added clock tolerance.

In FIG. 6, blocks 605, 610, 615, and 620 are differential to single-ended CMOS converter circuits in accordance with circuit 415 in FIG. 5. Circuit 600 of FIG. 6 cascades converter circuits 605 and 610 with converter circuits 615 and 620 in order to improve the effective gain. This sharpens the rise times and fall times and minimizes edge skew on the outputs of converter circuits 605 and 610, while providing lower input loading and a symmetrical output for smaller device dimensions. The CMOS inverters 625 and 630 in FIG. 6 are again designed such that the switching threshold is centered at half the differential swing. The outputs of inverters 625 and 630 are rail-to-rail CMOS and appropriate buffering can then be employed to drive the load of the next stage. The output signals of circuit 600 are an in-phase CMOS signal, DATA OUTPUT, and an out-of-phase CMOS signal, $\overline{DATA\ OUTPUT}$. In an alternate embodiment of the present invention, block 605, 610, 615, and 620 may also be implemented as another form of a differential to single-ended amplifier Although the present invention and its advantages have been described in detail, it should be understood that various changes, substitutions and alterations can be made herein without departing from the spirit and scope of the invention as defined by the appended claims.

What is claimed is:

1. A converter circuit, comprising:
   a first input terminal for receiving a first differential input signal;
   a second input terminal for receiving a second differential input signal;
   an output terminal; and
   a differential input stage, comprising:
      a first current load device coupled to a high voltage rail, wherein a first load current through said first current load device is determined by a static reference voltage;
      a second current load device coupled to said high voltage rail, wherein a second load current through said second current load device is controlled by said static reference voltage;
      a first input means coupled to said first current load device and said first input terminal for receiving said first differential input signal and controlling a first branch current through a first branch of said differential input stage, said first input means generating an output signal for transmission to said output terminal; and
      a second input means coupled to said second current load device and said second input terminal for receiving said second differential input signal, controlling a second branch current through a second branch of said differential input stage, and generating a control signal for controlling a third current in a current source device coupled to a low voltage rail and to said differential input stage, wherein said control signal is out-of-phase with said output signal.

2. The converter circuit in claim 1 wherein said first current load device is a first PFET transistor having a gate coupled to said static reference voltage and said second current load device is a second PFET transistor having a gate coupled to said static reference voltage.

3. The converter circuit in claim 1 further comprising a CMOS inverter coupled to said output terminal for receiving said output signal and generating a full-swing output signal having an upper limit substantially equal to a voltage level of said high voltage rail and a lower limit substantially equal to a voltage level of said low voltage rail.

4. The converter circuit in claim 1 further comprising a first clamping device for clamping a lower limit of said output signal at a predetermined voltage level below said high voltage rail.

5. The converter circuit in claim 4 further comprising a second clamping device for clamping a lower limit of said control signal at said predetermined voltage level below said high voltage rail.

6. A converter circuit, comprising:
   a first input terminal for receiving a first differential input signal;
   a second input terminal for receiving a second differential input signal;
   an output terminal; and
   a differential input stage, comprising:
      a first current load device coupled to a high voltage rail, wherein a first load current through said first current load device is determined by a static reference voltage;
      a second current load device coupled to said high voltage rail, wherein a second load current through said second current load device is controlled by said static reference voltage;
      a first input means coupled to said first current load device and said first input terminal for receiving said first differential input signal and controlling a first branch current through a first branch of said differential input stage, said first input means generating an output signal for transmission to said output terminal; and
      a second input means coupled to said second current load device and said second input terminal for receiving said second differential input signal, controlling a second branch current through a second branch of said differential input stage, and generating a control signal for controlling a third current in a current source device coupled to a low voltage rail and to said differential input stage, wherein an increase in said second branch current through said second input means causes a decrease in said first branch current, and wherein a magnitude of said decrease is greater than a magnitude of said increase.

7. The converter circuit in claim 6 wherein a decrease in said second branch current through said second input means causes an increase in said first branch current, wherein a magnitude of said increase is greater than a magnitude of said decrease.

8. A converter circuit, comprising:
a first input terminal for receiving a first differential input signal;
a second input terminal for receiving a second differential input signal;
an output terminal; and
a differential input stage comprising:
  a first current load device coupled to a high voltage rail, wherein a first load current through said first current load device is determined by a static reference voltage;
  a second current load device coupled to said high voltage rail, wherein a second load current through said second current load device is controlled by said static reference voltage;
  a first input means coupled to said first current load device and said first input terminal for receiving said first differential input signal and controlling a first branch current through a first branch of said differential input stage, said first input means generating an output signal for transmission to said output terminal, wherein an amplitude of said output signal is greater than an amplitude of said first input differential signal; and
  a second input means coupled to said second current load device and said second input terminal for receiving said second differential input signal, controlling a second branch current through a second branch of said differential input stage, and generating a control signal for controlling a third current in a current source device coupled to a low voltage rail and to said differential input stage.

9. A converter circuit, comprising:
a first input terminal for receiving a first differential input signal;
a second input terminal for receiving a second differential input signal;
an output terminal; and
a differential input stage, comprising:
  a first current load device coupled to a high voltage rail, wherein a first load current through said first current load device is determined by a static reference voltage;
  a second current load device coupled to said high voltage rail, wherein a second load current through said second current load device is controlled by said static reference voltage;
  a first input means coupled to said first current load device and said first input terminal for receiving said first differential input signal and controlling a first branch current through a first branch of said differential input stage, said first input means generating an output signal for transmission to said output terminal, wherein an amplitude of said output signal is greater than an amplitude of a difference between said first differential input signal and said second differential input signal; and
  a second input means coupled to said second current load device in said second input terminal for receiving said second differential input signal, controlling a second branch current through a second branch of said differential input stage, and generating a control signal for controlling a third current in a current source device coupled to a low voltage rail and to said differential input stage.

10. An integrated circuit comprising:
a first block of processing circuitry, said first block of processing circuitry generating a pair of differential signals on a first differential output terminal and a second differential output terminal;
a converter circuit, comprising:
  a first input terminal coupled to said first differential output terminal for receiving a first differential input signal;
  a second input terminal coupled to said second differential output terminal for receiving a second differential input signal;
  an output terminal;
  a differential input stage comprising:
    a first current load device coupled to a high voltage rail, wherein a first load current through said first current load device is determined by a static reference voltage;
    a second current load device coupled to said high voltage rail, wherein a second load current through said second current load device is controlled by said static reference voltage;
    a first input means coupled to said first current load device and said first input terminal for receiving said first differential input signal and controlling a first branch current through a first branch of said differential input stage, said first input means generating an output signal for transmission to said output terminal; and
    a second input means coupled to said second current load device and said second input terminal for receiving said second differential input signal, controlling a second branch current through a second branch of said differential input stage, and generating a control signal for controlling a third current in a current source device coupled to a low voltage rail and to said differential input stage, wherein said control signal is out-of-phase with said output signal; and
  a CMOS inverter coupled to said output terminal for receiving said output signal and generating a full-swing output signal having an upper limit substantially equal to a voltage level of said high voltage rail and a lower limit substantially equal to a voltage level of said low voltage rail.

11. The integrated circuit in claim 10 wherein said first current load device is a first PFET transistor having a gate coupled to said static reference voltage and said second current load device is a second PFET transistor having a gate coupled to said static reference voltage.

12. The integrated circuit in claim 10 further comprising a first clamping device for clamping a lower limit of said output signal at a predetermined voltage level below said high voltage rail.

13. The integrated circuit in claim 12 further comprising a second clamping device for clamping a lower limit of said control signal at said predetermined voltage level below said high voltage rail.

14. An integrated circuit comprising:
a first block of processing circuitry, said first block of processing circuitry generating a pair of differential signals on a first differential output terminal and a second differential output terminal;

a converter circuit, comprising:
  a first input terminal coupled to said first differential output terminal for receiving a first differential input signal;
  a second input terminal coupled to said second differential output terminal for receiving a second differential input signal;
  an output terminal;
  a differential input stage comprising:
    a first current load device coupled to a high voltage rail, wherein a first load current through said first current load device is determined by a static reference voltage;
    a second current load device coupled to said high voltage rail, wherein a second load current through said second current load device is controlled by said static reference voltage;
    a first input means coupled to said first current load device and said first input terminal for receiving said first differential input signal and controlling a first branch current through a first branch of said differential input stage, said first input means generating an output signal for transmission to said output terminal; and
    a second input means coupled to said second current load device and said second input terminal for receiving said second differential input signal, controlling a second branch current through a second branch of said differential input stage, and generating a control signal for controlling a third current in a current source device coupled to a low voltage rail and to said differential input stage, wherein an increase in said second branch current through said second input means causes a decrease in said first branch current, wherein a magnitude of said decrease is greater than a magnitude of said increase; and
    a CMOS inverter coupled to said output terminal for receiving said output signal and generating a full-swing output signal having an upper limit substantially equal to a voltage level of said high voltage rail and a lower limit substantially equal to a voltage level of said low voltage rail.

15. The integrated circuit in claim 14 wherein a decrease in said second branch current through said second input means causes an increase in said first branch current, wherein a magnitude of said increase is greater than a magnitude of said decrease.

16. An integrated circuit comprising:
a first block of processing circuitry, said first block of processing circuitry generating a pair of differential signals on a first differential output terminal and a second differential output terminal;
a converter circuit, comprising:
  a first input terminal coupled to said first differential output terminal for receiving a first differential input signal;
  a second input terminal coupled to said second differential output terminal for receiving a second differential input signal;
  an output terminal;
  a differential input stage comprising:
    a first current load device coupled to a high voltage rail, wherein a first load current through said first current load device is determined by a static reference voltage;
    a second current load device coupled to said high voltage rail, wherein a second load current through said second current load device is controlled by said static reference voltage;
    a first input means coupled to said first current load device and said first input terminal for receiving said first differential input signal and controlling a first branch current through a first branch of said differential input stage, said first input means generating an output signal for transmission to said output terminal, wherein an amplitude of said output signal is greater than an amplitude of said first input differential signal; and
    a second input means coupled to said second current load device and said second input terminal for receiving said second differential input signal, controlling a second branch current through a second branch of said differential input stage, and generating a control signal for controlling a third current in a current source device coupled to a low voltage rail and to said differential input stage, wherein an increase in said second branch current through said second input means causes a decrease in said first branch current; and
    a CMOS inverter coupled to said output terminal for receiving said output signal and generating a full-swing output signal having an upper limit substantially equal to a voltage level of said high voltage rail and a lower limit substantially equal to a voltage level of said low voltage rail.

17. An integrated circuit comprising:
a first block of processing circuitry, said first block of processing circuitry generating a pair of differential signals on a first differential output terminal and a second differential output terminal;
a converter circuit, comprising:
  a first input terminal coupled to said first differential output terminal for receiving a first differential input signal;
  a second input terminal coupled to said second differential output terminal for receiving a second differential input signal;
  an output terminal;
  a differential input stage comprising:
    a first current load device coupled to a high voltage rail, wherein a first load current through said first current load device is determined by a static reference voltage;
    a second current load device coupled to said high voltage rail, wherein a second load current through said second current load device is controlled by said static reference voltage;
    a first input means coupled to said first current load device and said first input terminal for receiving said first differential input signal and controlling a first branch current through a first branch of said differential input stage, said first input means generating an output signal for transmission to said output terminal, wherein an amplitude of said output signal is greater than an amplitude of a difference between said first differential input signal and said second differential input signal; and
    a second input means coupled to said second current load device and said second input terminal for receiving said second differential input signal, controlling a second branch current through a second branch of said differential input stage, and generating a control signal for controlling a third current in a current source device coupled to a low voltage rail and to said differential input stage; and a CMOS inverter coupled to said output terminal for receiving said output signal and generating a full-swing output signal having an upper limit substantially equal to a voltage level of said high voltage rail and a lower limit substantially equal to a voltage level of said low voltage rail.

* * * * *